United States Patent
Hirai et al.

(10) Patent No.: US 6,388,321 B1
(45) Date of Patent: May 14, 2002

(54) ANISOTROPIC CONDUCTIVE FILM AND RESIN FILLING GAP BETWEEN A FLIP-CHIP AND CIRCUIT BOARD

(75) Inventors: Hiroyuki Hirai, Sagamihara; Yoshitaka Fukuoka, Hachioji, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/604,719

(22) Filed: Jun. 28, 2000

(30) Foreign Application Priority Data

Jun. 29, 1999 (JP) ............................................. 11-184404

(51) Int. Cl.[7] .............................................. H01L 23/48
(52) U.S. Cl. ........................ 257/737; 257/775; 257/779; 257/783; 361/773; 361/774; 174/259
(58) Field of Search ................................. 257/737, 738, 257/778, 779, 780, 782, 783, 775; 228/180, 22; 174/259, 260; 361/760, 773, 774

(56) References Cited

U.S. PATENT DOCUMENTS

| | | | |
|---|---|---|---|
| 4,740,657 A | * 4/1988 | Tsukagoshi et al. | 174/88 |
| 5,586,892 A | * 12/1996 | Sato | 439/91 |
| 5,611,481 A | * 3/1997 | Akamatsu et al. | 228/180.22 |
| 5,915,753 A | 6/1999 | Motomura et al. | |
| 5,922,496 A | * 7/1999 | Dalal et al. | 430/5 |
| 5,949,142 A | * 9/1999 | Otsuka | 257/737 |
| 5,977,637 A | * 11/1999 | Akamatsu et al. | 257/772 |
| 6,051,273 A | * 4/2000 | Dala et al. | 427/124 |
| 6,081,038 A | * 6/2000 | Murayama | 257/783 |
| 6,097,610 A | * 8/2000 | Hashimoto | 361/760 |
| 6,103,553 A | * 8/2000 | Park | 438/119 |
| 6,223,429 B1 | * 5/2001 | Kaneda et al. | 29/832 |
| 6,259,163 B1 | * 7/2001 | Ohuchi et al. | 257/779 |

FOREIGN PATENT DOCUMENTS

| | | | |
|---|---|---|---|
| JP | 9-162230 | | 6/1997 |
| JP | 11-67832 | | 3/1999 |
| JP | 11-135561 | | 5/1999 |
| JP | 2000/12617 | * | 1/2000 |
| JP | 2000/150576 | * | 5/2000 |

\* cited by examiner

Primary Examiner—David L. Talbott
Assistant Examiner—Alonzo Chambliss
(74) Attorney, Agent, or Firm—Finnegan, Henderson, Farabow, Garrett & Dunner, L.L.P.

(57) ABSTRACT

In order to obtain a semiconductor device of which bonding reliability between a semiconductor element 7 and a printed wiring board 1 is improved and a manufacturing method thereof, in a semiconductor device mounted a semiconductor element 7 on a printed wiring board 1, while a circumference of a metal bump 3 formed on a conductor pad electrode disposed on the printed wiring board in wiring pattern and an electrode 6 disposed along an external periphery of a semiconductor element 7 facing the metal bump 3 is provided with, along a placement position of the metal bump 3 or the electrode 6, frame- or wall-shaped anisotropic conductive film 4, a gap between the semiconductor element 7 and the printed wiring board 1, the insides of the anisotropic conductive film 4 formed in frame or wall shape, is filled by sealing material such as epoxy resin or the like.

16 Claims, 6 Drawing Sheets

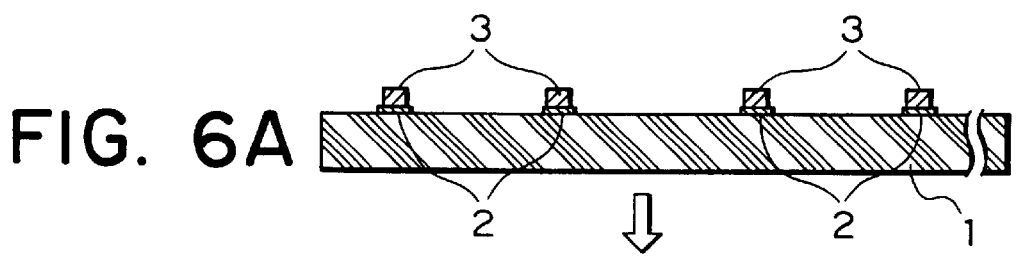
FIG. 6A
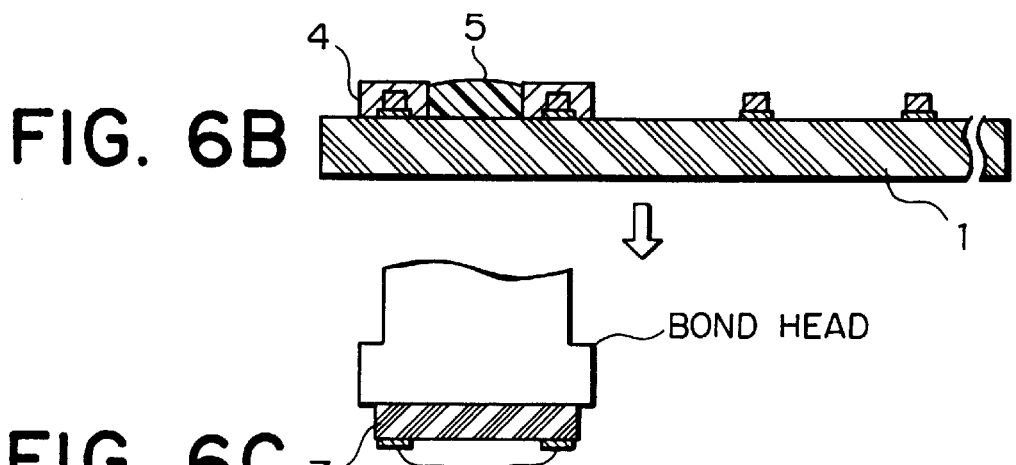
FIG. 6B
FIG. 6C
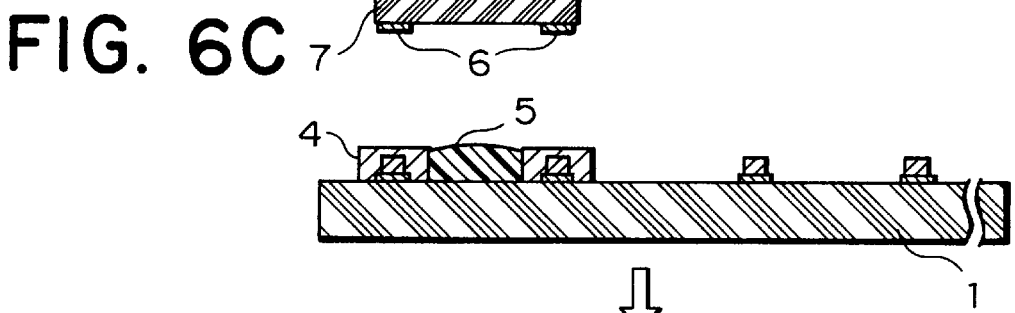
FIG. 6D
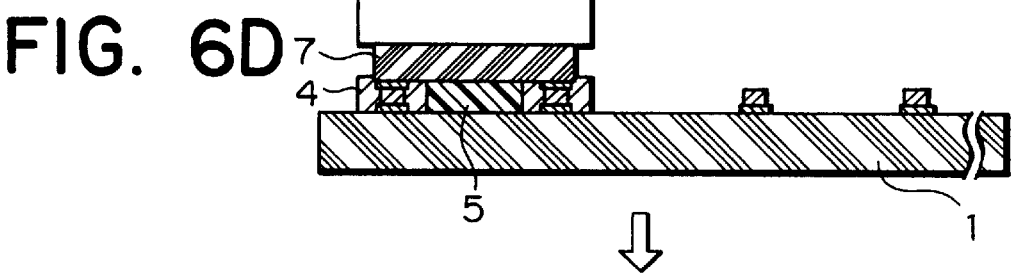
FIG. 6E
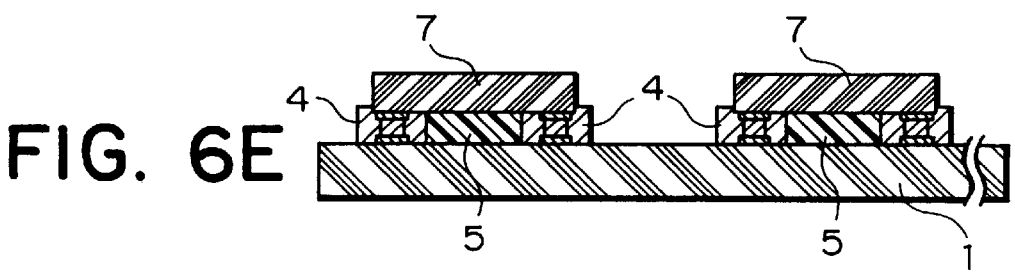

ANISOTROPIC CONDUCTIVE FILM AND RESIN FILLING GAP BETWEEN A FLIP-CHIP AND CIRCUIT BOARD

BACKGROUND OF THE INVENTION

1. Field of the Invention

The present invention relates to a flip-chip mounted semiconductor device and a manufacturing method thereof, in particular relates to a semiconductor device of which layer filling a gap between a semiconductor element and a printed wiring board consists of anisotropic conductive film and resin and a manufacturing method thereof.

2. Description of the Related Art

Recent advancements in downsizing, thinning or light-weight and high performance of various electronic instruments, in particular of information instruments such as personal computers and portable telephones is remarkable. In particular, in semiconductor devices, further integration and higher performance are demanded. As a result, further or, advancements are demanded in high-density mounting technology. Among them is the bare-chip mounting method.

In flip-chip mounting that is a typical mounting method, a bare chip is mounted through a protruded electrode (bump electrode) on a printed wiring board. After flip-chip mounting, in a gap generated between a semiconductor chip and the printed wiring board, filler such as resin is filled, followed by bonding with a motherboard to implement packaging.

With reference to FIG. 8, a semiconductor device due to an existing flip-chip mounting method will be explained. On a conductor pad electrode 2 of a printed wiring board 1, a metal bump 3 is formed. On a prescribed position of the printed wiring board thereon a semiconductor element 7 is mounted, as a filling layer, an anisotropic conductive film (ACF) 4 including a conductive particle 4a is stuck. Thereafter, a rear face of the semiconductor element 7 provided with an aluminum electrode 6 is pressurized and heated to electrically and mechanically bond the semiconductor element 7 and the printed wiring board 1, thereby assembling a semiconductor device.

The existing semiconductor device in which anisotropic conductive film alone is used is remarkably poor in reliability, particularly poor in adherence due to being hygroscopic. Accordingly, there are problems that bonding failure occurs between the semiconductor element and the printed wiring board.

Even in using, instead of the anisotropic conductive film, anisotropic conductive paste (ACP), there are similar problems.

Further, usually, after flip-chip mounting of a semiconductor element, solder reflow step is carried out to solder mount a chip component or to form solder bump for external terminals. Due to heat acting during the reflow step, a board becomes liable to warp. Due to warping of the board, a soldered portion of the board tends to peel. Accordingly, after the reflow, the electrode 6 of the semiconductor element 7 and the conductor pad electrode 2 of the printed wiring board 1 are peeled or being peeled therebetween to result in an increase of connection resistance.

SUMMARY OF THE INVENTION

As mentioned above, in the existing filling layer consisting only of the anisotropic conductive film 4, due to being hygroscopic, bonding failure between the semiconductor element 7 and the printed wiring board 1 is caused or after the reflow, the connection resistance between the semiconductor element 7 and the printed wiring board 1 increases.

The present invention is made to solve the aforementioned existing problems. That is, the object of the present invention is to provide a semiconductor device of which bonding reliability between a semiconductor element and a printed wiring board is improved and a manufacturing method thereof.

A semiconductor device of the present invention comprises a printed wiring board and a semiconductor element mounted through a protrusion and a filling layer on the printed wiring board, the filling layer consisting of resin and anisotropic conductive member.

In the present semiconductor device, between the printed wiring board and the semiconductor element, the anisotropic conductive member is formed in frame, the resin being filled in the frame.

In the present invention, though the anisotropic conductive member is formed so as to completely surround the resin, the frame-shaped anisotropic conductive member may be partly truncated.

A manufacturing method of semiconductor devices, one mode of the present invention, comprises the steps of forming a protrusion on an area where a semiconductor element is formed on the printed wiring board; forming anisotropic conductive member in frame on the semiconductor element area thereon the protrusion is formed; filling resin in the frame; mounting a semiconductor element through the protrusion, the anisotropic conductive member and the resin; curing the anisotropic conductive member; and curing the resin.

A manufacturing method of semiconductor devices, another mode of the present invention, comprises the steps of forming a protrusion on an area where a semiconductor element is formed on a printed wiring board; forming anisotropic conductive member in frame on the semiconductor element area thereon the protrusion is formed; filling resin in the frame; mounting a semiconductor element through the protrusion, the anisotropic conductive member and the resin; and curing the anisotropic conductive member and the resin.

BRIEF DESCRIPTION OF DRAWINGS

FIGS. 6A–6E show vertical sectional views illustrating states of the printed wiring board in each step of a manufacturing method of a semiconductor device involving the present invention.

DESCRIPTION OF PREFERRED EMBODIMENTS

Embodiment 1

With reference to FIGS. 1 through 6, the present invention will be described.

Figure 1:
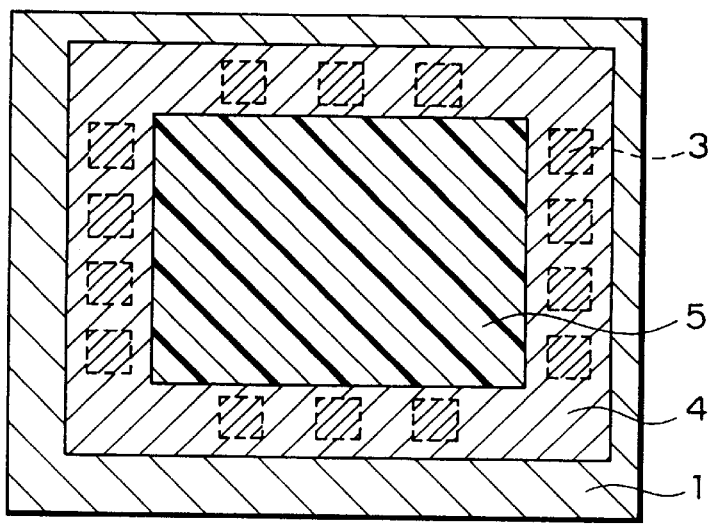
FIG. 1 is a plan view of a printed wiring board in a semiconductor device due to one embodiment of the present invention.

FIG. 1 is a plan view of a printed wiring board due to one embodiment of the present invention before mounting a semiconductor element.

On a portion on a printed wiring board 1 corresponding to an area where a semiconductor element is formed, a metal bump 3 as protrusion is formed, so as to cover that a frame-or wall-shaped anisotropic conductive film 4 as anisotropic conductive member being formed, inside of the anisotropic conductive film 4 underfill 5 consisting of for instance epoxy based resin as resin layer being filled.

In the present invention, the underfill 5 has a structure in which inside the anisotropic conductive film 4 formed in frame or wall shape so as to cover the metal bump 3 epoxy based resin is filled.

The metal bump 3 consisting of solder is formed on a conductor pad electrode 2 as wiring pattern formed on the printed wiring board 1. Conductive filler 4a existing in the anisotropic conductive film 4 as conductive particle is collapsed between both electrodes 2 and 6 due to heat and pressure during bonding to give conductivity and bond between the metal bump 3 and the electrode formed on the semiconductor element 7.

As mentioned above, since the anisotropic conductive film 4 is poor in moisture resistance, moisture is liable to enter into between the semiconductor element 7 and the printed wiring board 1 which tends to cause peeling. However, according to the present invention, the anisotropic conductive film 4 is used for bonding an external periphery of the semiconductor element 7, inside thereof the underfill 5 consisting of epoxy based resin high in adherence being filled. Accordingly, excellent adherence strength can be realized.

In the present invention, the anisotropic conductive film 4 need not completely surround the epoxy based resin underfill 5, but may be partly truncated.

When being partly truncated, during coating the epoxy based resin underfill 5 followed by mounting the semiconductor element 7, deaeration out of the inside of the frame of the anisotropic conductive film 4 can be easily carried out to result in suppression of residual air. Further, air, when being entrapped inside of the frame of the anisotropic conductive film 4, expands due to heating during curing the epoxy resin. However, when the anisotropic conductive film 4 is partly truncated, from the truncation air becomes easily exhausted. As a result, between the semiconductor element 7 and the printed wiring board 1, bubbles can be prevented from remaining.

In the present invention, the anisotropic conductive film 4 is composed of binder and conductive filler 4a. The binder is thermosetting resin such as epoxy based one or phenol based one, or thermoplastic resin such as urethane based one or polyester based one. The conductive filler 4a is obtained by gold plating nickel or silver particles as metal base or by gold plating phenol based or styrene based fine particles having solder particles and resin material as base.

The conductive filler 4a exists, in general, with a ratio of 10 pieces or more per 0.1 mm$^3$, the diameter thereof being approximately 5 μm. To the anisotropic conductive film 4, in general, an interleaf that is called separator is attached. In using, the interleaf is peeled.

Glass transition temperature of the epoxy based resin used for the anisotropic conductive film 4 is less than 150° C.

As the anisotropic conductive film 4 being used in the present invention, for instance MJ 932 (Tg: 144° C., modulus of elasticity (25° C.) : 1.6×10$^{10}$ dyne/cm$^2$, coefficient of linear expansion: 40 ppm/° C.), FP11411 (Tg: 110° C., modulus of elasticity (25° C.): 1.0×10$^{10}$ dyne/cm$^2$, coefficient of linear expansion: 52 ppm/° C.), FP10425 (Tg: 142° C., modulus of elasticity (25° C.): 1.5×10$^{10}$ dyne/cm$^2$, coefficient of linear expansion: 48 ppm/° C.), MT53 (Tg: 147° C., modulus of elasticity (25° C.): 1.5×10$^{10}$ dyne/cm$^2$, coefficient of linear expansion: 40 ppm/° C.), all being sold by Sony Chemical Corporation, and so on can be illustrated. However, the anisotropic conductive film 4 is not restricted thereto.

In addition, as the filling resin to be used in the resin layer, liquid epoxy based resin can be used, the glass transition temperature thereof being 150° C. or more.

Further, as the filling resin, one or two or more resins selected from a group consisting of epoxy resin, phenolic resin and polyester resin having physical properties of viscosity of 1000 to 9000 cp/25° C., glass transition is temperature of 150° C. or more, and coefficient of linear expansion of 25 to 32 ppm/° C. can be cited.

The reason why the viscosity is restricted in the range of 1000 to 9000 cp/25° C. is as follows. When the viscosity is under the range, in filling the resin, the resin flows out of the truncation of the anisotropic conductive film 4 to cause an adverse effect. When the viscosity is over the range to the contrary, the resin can not be sufficiently filled up to the corner of the anisotropic conductive film 4 to cause an adverse effect.

Further, the reason why the glass transition temperature is set at 150° C. or more is as follows. When the glass transition temperature is lower than 150° C., screening (aging) temperature is restricted to a temperature lower than 150° C. to cause an inconvenience.

Still further, the reason why the coefficient of linear expansion is set in the range of 25 to 32 ppm/° C. is as follows. When the coefficient of linear expansion is under the range, such an adverse effect occurs that compressive stress is added on a surface of the semiconductor element. On the other hand, when the coefficient of linear expansion is over the range, such an adverse effect occurs that tensile stress is added on the surface of the semiconductor element.

Among the above, as the liquid epoxy based resin, in specific, T-693/R-3002 (Tg (DMA) : 155° C., viscosity (25° C.): 3,000cP, coefficient of linear expansion: 30 ppm/° C.), T-693/R-3001 (Tg (DMA) : 155° C., viscosity (25° C.) : 1,000cP, coefficient of linear expansion: 40 ppm/° C.), T-693/R-3003 (Tg (DMA): 155° C., viscosity (25° C.): 9,000 cP, coefficient of linear expansion: 26 ppm/° C), UFR-101 (Tg (DMA): 163° C., viscosity (25° C.): 3,000 cP, coefficient of linear expansion: 32 ppm/° C), T-693/R-3200 (Tg (DMA): 168° C., viscosity (25° C.): 26,000 cP, coefficient of linear expansion: 26 ppm/° C), UFR-100 (Tg (DMA): 163° C., viscosity (25° C.): 5,000 cP, coefficient of linear expansion: 30 ppm/° C), UFR-102 (Tg (DMA): 163° C., viscosity (25° C.): 3,000 cP, coefficient of linear expansion: 32 ppm/° C.), all of which are sold from Chiba Specialty Chemicals Corporation, and so on can be illustrated. However, the liquid epoxy based resin is not restricted thereto.

Next the shape of the conductive filler 4a of the semiconductor device involving the present invention and interrelationship between the conductive filler 4a, the metal bump 3 and the electrode 6 will be explained.

Figure 3:
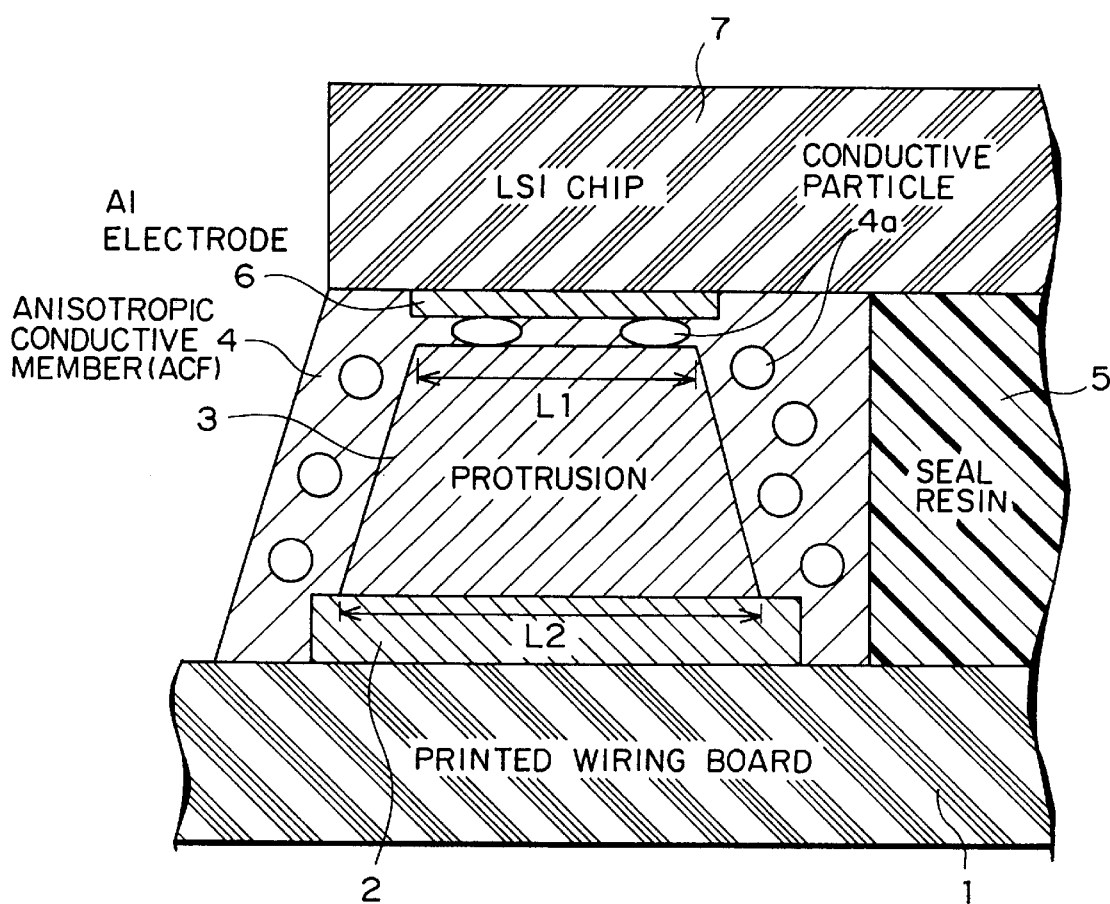
FIG. 3 is a diagram partly enlarged a vertical section of a semiconductor device involving the present invention.
Figure 4:
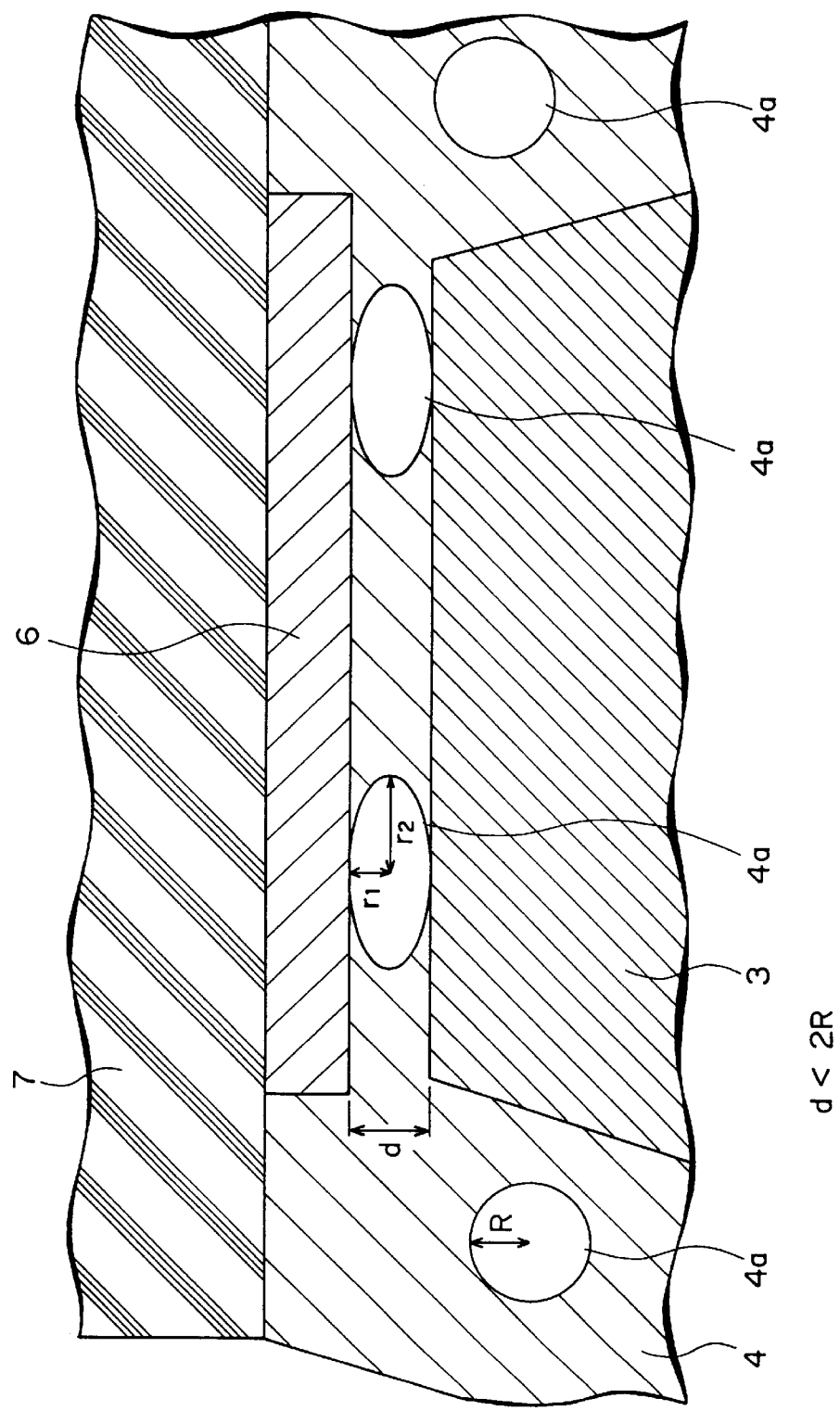
FIG. 4 is a diagram enlarged a vertical section of a conductive particle 4a sandwiched between an electrode and a metal bump involving the present invention.

FIG. 3 is a diagram partly enlarged a vertical section of a semiconductor device involving the present invention, FIG. 4 being a diagram enlarged a vertical section of the conductive filler 4a sandwiched between the electrode 6 and the metal bump 3.

As shown in FIGS. 3 and 4, in the semiconductor device involving the present invention, the electrode 6 and the metal bump 3 are preferably approached until a distance d therebetween becomes smaller than a diameter 2R of the conductive filler 4a.

This is due to the following reasons. That is, when the electrode 6 and the metal bump 3 are approached until the distance d therebetween becomes smaller than the diameter 2R of the conductive filler 4a, the following effect can be obtained. That is, during high temperature or absorbing moisture, if the anisotropic conductive film 4 expanded for the distance d between the electrode 6 and the metal bump 3 to be larger, the conductive filler 4a would follow to maintain connection.

Thus, in the present invention, since the electrode 6 and the metal bump 3 are approached until the distance d becomes d<2R, the conductive filler 4a sandwiched therebetween, as shown in FIGS. 3 and 4, is deformed until the vertical section thereof becomes elliptic.

When a minor axis of an ellipse which the vertical section of the conductive filler 4a draws at this time, that is, a dimension in a direction of thickness of the printed wiring board, is r1, and a major axis thereof, that is, a dimension in a direction perpendicular to the direction of thickness of the printed wiring board, is r2, a ratio between the minor axis and the major axis, that is, r1: r2, is preferable to be r1:r2=1:2 to 1:3.

Here, the reason why the preferable ratio between the minor axis and the major axis is restricted in the aforementioned range is as follows. When the ratio is under the range, such an adverse effect occurs that it is difficult to follow the distance d to result in less stable bonding. On the contrary, when the ratio is over the aforementioned range, an inconvenience occurs that the conductive filler 4a is plastic deformed.

The electrode 6 and the metal bump 3 are pressurized to approach to each other so that the conductive filler 4a becomes an ellipse of such a shape. Thereby, a contact area between the electrode and the conductive filler 4a and that between the conductive filler 4a and the metal bump 3 is increased to form more secured electrical bonding.

The metal bump 3 and the electrode 6 may be pressurized to come into direct contact therebetween. In this case, at a portion where the metal bump 3 and the electrode 6 come into direct contact, electrical contact is formed. Even at a portion where the metal bump 3 and the electrode 6 do not come into direct contact, between the metal bump 3 and the electrode 6, the conductive filler 4a comes into there to electrically bond the metal bump 3 and the electrode 6.

Next, as shown in FIGS. 3 and 4, the metal bump 3 is preferable to be trapezoidal. in its vertical section. When a length of an upper side of the trapezoid is L1 and that of a lower side is L2, a ratio between the upper side and the lower side, that is, L1: L2 is preferable to be in the range of L1: L2=1:1 to 1:1.5.

Here, the reason why a preferable range of the ratio between the upper side and the lower side is set in the above range is as follows. When the ratio is under the above range, the following detrimental effect occurs that during pressurizing, when the electrode 6 pressurizes the metal bump 3, pressurization in a vertical direction becomes difficult. On the contrary, when the ratio is over the range, the following detrimental effect occurs that during pressurizing, the metal bump 3 is inserted in the anisotropic conductive film 4 with difficulty.

Figure 5:
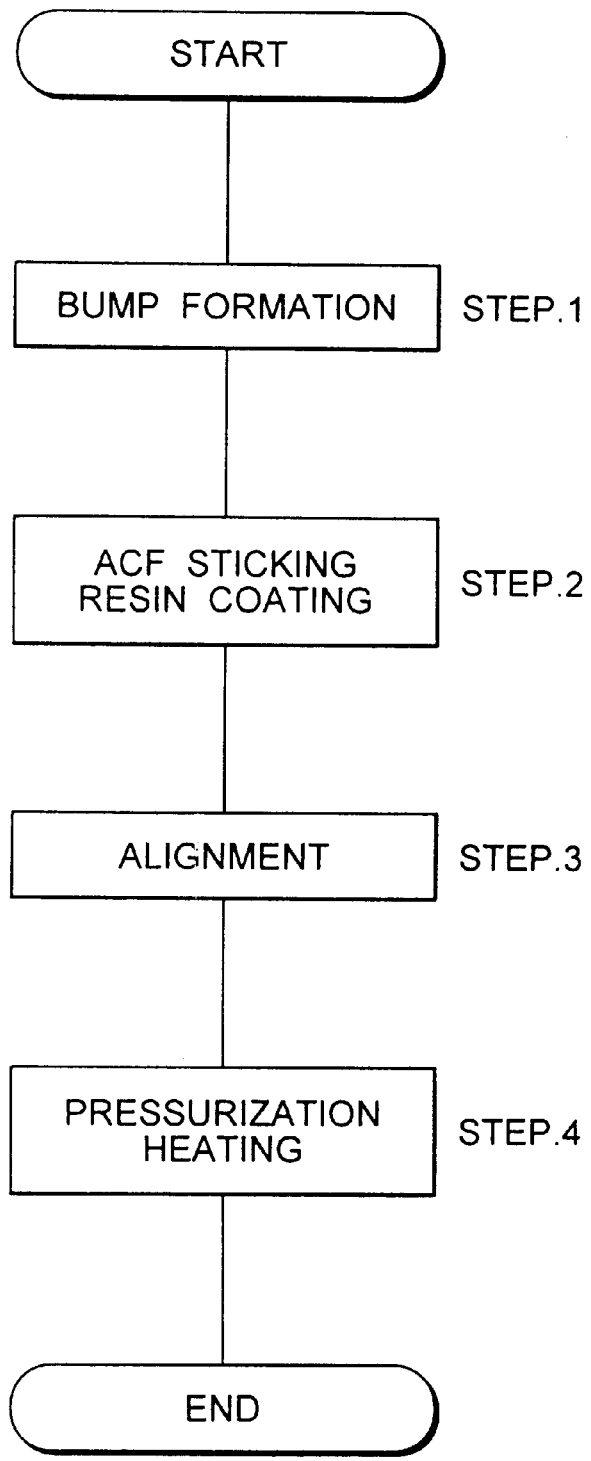
FIG. 5 is a flowchart showing manufacturing steps of a semiconductor device involving the present invention. present invention.
Figure 7:
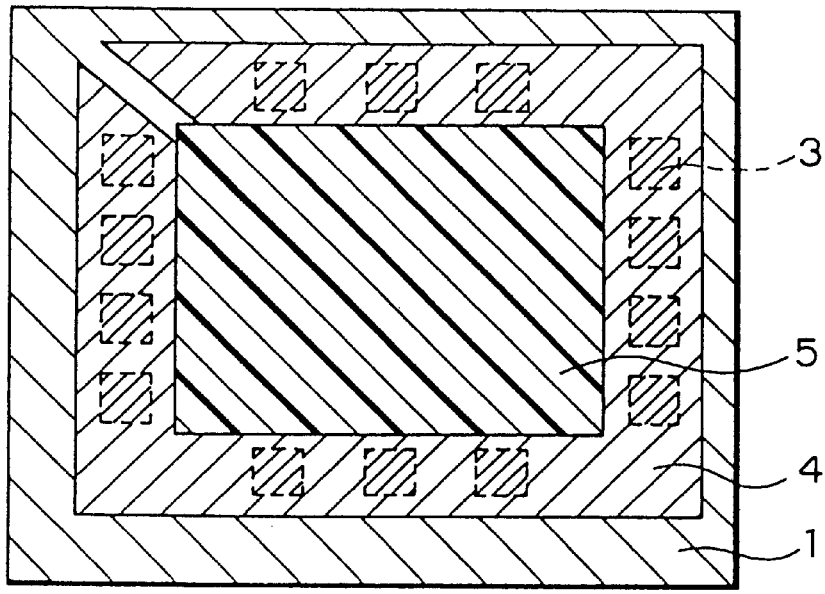
FIG. 7 is a plan view of a printed wiring board in a semiconductor device due to a modification embodiment of the present invention.
Figure 8:
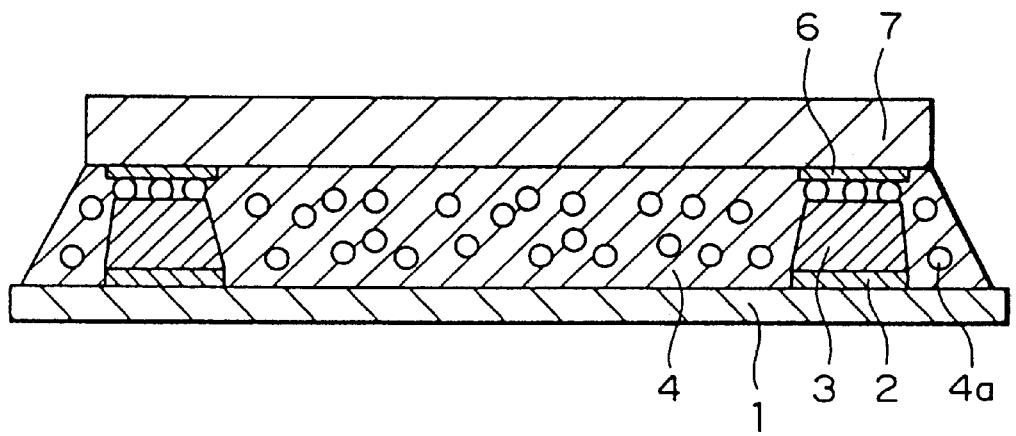
FIG. 8 is a sectional view of an existing semiconductor device.

Next, manufacturing processes of a semiconductor device involving the present invention will be explained with reference to FIGS. 2, 5 and 6.

Figure 2:
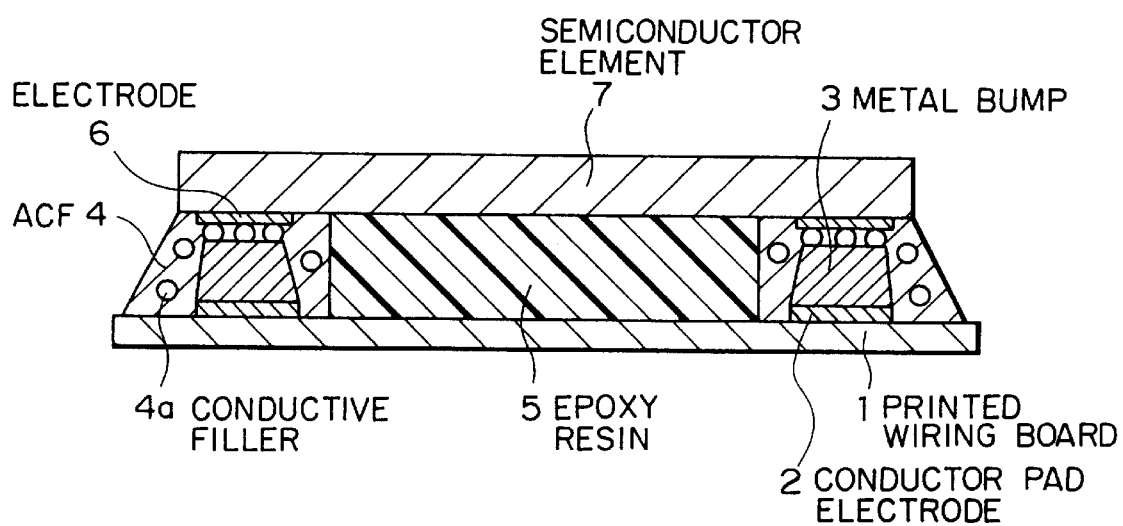
FIG. 2 is a sectional view of a semiconductor device due to one embodiment of the present invention.

FIG. 2 is a sectional view of a semiconductor device according to one embodiment of the present invention. FIG. 5 is a flowchart showing manufacturing steps of a semiconductor device, FIG. 6 being a vertical sectional view illustrating a state of a printed wiring board in each step.

As shown in FIG. 6A, with a printed wiring board 1 of a thickness of for instance approximately 1 mm, thereon 1 a conductor pad electrode 2 is formed. Thereafter, further thereon, a metal bump 3 is formed with a height of for instance approximately 30 μm (step 1).

Then, as shown in FIG. 6B, so as to cover the conductor pad electrode 2 and the metal bump 3, along the most extreme edge portion of an area where a semiconductor element is formed, anisotropic conductive film 4 of a thickness of for instance approximately 50 μm is stuck in frame or wall (step 2).

Similarly, as shown in FIG. 6B, underfill 5 made of epoxy resin is coated in a rectangular area surrounded by the anisotropic conductive film 4 with a thickness of for instance approximately 30 μm (step 2).

Then, as shown in FIG. 6C, an aluminum electrode 6 formed on a semiconductor element 7 is aligned to match the metal bump 3 (step 3), thereafter the semiconductor element 7 is mounted on the printed wiring board 1.

In mounting the semiconductor element 7 on the printed wiring board 1, as shown in FIG. 6D, a rear face of the semiconductor element 7 is heated under pressure, for instance under the conditions of 3 kg/cm$^2$, 80 to 100° C., and 5 seconds, to cure the anisotropic conductive film 4 (step 4). At this time, due to pressurization, excess underfill 5 composed of epoxy resin flows over the anisotropic conductive film 4 to drop.

Further, by heating with a microwave oven under the conditions of for instance 150° C. and 30 minutes, the underfill 5 made of epoxy resin is cured to bond the aluminum electrode 6 of the semiconductor element 7 and the conductor pad electrode 2 of the printed wiring board 1. Thereafter, a motherboard is bonded, followed by packaging.

As the condition of the pressurization, a weight of 20 to 40 kg/cm$^2$ is preferably applied. Here, the reason why the preferable weight during pressurization is set in the above range is as follows. When the weight is under the range, such a detrimental effect occurs that the anisotropic conductive film 4 can not be sufficiently pressurized to be a larger distance d between the electrode 6 and the metal bump 6, resulting in no bonding. On the contrary, when the weight is over the above range, such a detrimental effect occurs that the metal bump 3 is destroyed.

In addition, the heating is preferable to be implemented in the range of 150 to 250° C.

Here, the reason why the heating temperature is restricted in the above range is as follows. When the temperature is under the range, such a detrimental effect occurs that the anisotropic conductive film 4 and the resin can not be sufficiently cured. By contrast, when the temperature is over the above range, such a detrimental effect occurs that the anisotropic conductive film 4 and the resin are excessively cured to cause thermal deterioration.

In a manufacturing method of a semiconductor device of the present invention, the frame-shaped anisotropic conductive member can be partly truncated.

According to the present invention, a combination of the anisotropic conductive film 4 and the underfill 5 made of epoxy resin is used as the filling layer. Accordingly, due to the action of the epoxy resin, sufficient moisture resistance can be obtained. Further, due to the action of the anisotropic conductive film 4, the semiconductor element 7 and the printed wiring board 1 can be bonded with reliability.

In the manufacturing method of a semiconductor device of the present invention, the anisotropic conductive film 4 and the filling resin can be heated, depending on the material to be used, in one step or in two separate steps. The curing temperature is appropriately adapted to the material to be used.

Embodiment 2

Similarly with embodiment 1, on a printed wiring board 1 of a thickness of for instance approximately 1 mm, a conductor pad electrode 2 is formed, further thereon a metal bump 3 being formed with a height of for instance approximately 30 µm. So as to cover these, along the most extreme edge portion of an area where a semiconductor element is formed, a frame-shaped anisotropic conductive film 4 of a thickness of for instance approximately 50 µm is stuck.

Next, underfill 5 composed of epoxy resin is coated in a rectangular area surrounded by anisotropic conductive film 4 with a thickness of for instance approximately 30 µm, a semiconductor element 7 being mounted so that an aluminum electrode 6 formed thereon 7 fits the metal bump 3.

A rear face of the semiconductor element 7 is pressurized and heated under the conditions of for instance 3 kg/cm$^2$, 230° C. and 30 seconds to cure the anisotropic conductive film 4 and the underfill 5 made of epoxy resin, resulting in bonding the aluminum electrode 6 of the semiconductor element 7 and the conductor pad electrode 2 of the printed wiring board 1. Thereafter, a motherboard is bonded and packaging is implemented.

In the semiconductor device involving the present embodiment, along the most extreme edge portion of an area where a semiconductor element 7 is formed, the anisotropic conductive film 4 is stuck in frame or wall shape. Accordingly, the following effect can be expected that to a circuit portion disposed on a center portion of the semiconductor element, the conductive filler 4a neither contact nor approach, resulting in excellent electrical performance (insulation, migration or the like).

Embodiment 3

With the exception of truncating one or more of four corners of a frame-shaped anisotropic conductive film 4, similarly with embodiment 1 a semiconductor device is manufactured.

According to the present embodiment, air entrapped during coating the underfill 5 made of epoxy resin is exhausted during mounting the semiconductor element and curing the resin, resulting in further excellent adherence.

Embodiment 4

With exception of truncating one or more of four corners of a frame-shaped anisotropic conductive film 4, similarly with embodiment 2 a semiconductor device is manufactured.

According to the present embodiment, air entrapped during coating the underfill 5 made of epoxy resin is rapidly exhausted in mounting the semiconductor element 7 and curing the resin, resulting in further excellent adherence.

According to the present invention, by employing a combination of anisotropic conductive film 4 and underfill 5 made of epoxy resin as a filling layer, a semiconductor device excellent in moisture resistance and adherence and a manufacturing method thereof can be provided.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor device, comprising:

a printed wiring board having a wiring pattern;

a semiconductor element disposed on the printed wiring board;

a filling layer intervened between the printed wiring board and the semiconductor element and comprising a resin layer and an anisotropic conductive member including conductive particles; and a protrusion of a shape having a trapezoidal vertical section in which a ratio of an upper side and a lower side of the trapezoid is in a range of 1:1 to 1:1.5, formed on the wiring pattern and, together with the anisotropic conductive member, electrically bonding the wiring pattern and an electrode of the semiconductor element.

2. The semiconductor device as set forth in claim 1:

wherein the anisotropic conductive member is formed in a frame along the electrode of the semiconductor element, the resin layer being filled inside of the anisotropic conductive member formed in the frame.

3. The semiconductor device as set forth in claim 2:

wherein the anisotropic conductive member is partly truncated.

4. The semiconductor device as set forth in claim 3:

wherein at least one truncation is formed at a corner of the anisotropic conductive member formed in the frame.

5. The semiconductor device as set forth in claim 1:

wherein the conductive particles intervened between the protrusion and the electrode of the semiconductor element possesses a shape having an approximately elliptic vertical section having a minor axis in a direction of a thickness and a major axis in a longitudinal direction of the board.

6. The semiconductor device as set forth in claim 5:

wherein a ratio of the minor axis to the major axis is in a range of 1:2 to 1:3.

7. The semiconductor device as set forth in claim 1:

wherein the conductive particles are comprised of elastic material having a conductive material layer on a surface thereof.

8. The semiconductor device as set forth in claim 1:

wherein a tip end of the protrusion and an electrode of the semiconductor element are in direct contact.

9. A semiconductor device, comprising:

a printed wiring board having a wiring pattern;

a semiconductor element disposed on the printed wiring board;

a protrusion of a shape having a trapezoidal vertical section in which a ratio of an upper side and a lower side of the trapezoid is in a range of 1:1 to 1:1.5, formed on the wiring pattern of a portion facing an electrode of the semiconductor element;

an anisotropic conductive member including conductive particles intervened at least between the protrusion and the electrode and electrically bonding the protrusion and the electrode; and a resin layer filled adjacent to the anisotropic conductive member and sealing the semiconductor element and the printed wiring board.

10. The semiconductor device as set forth in claim 9:

wherein the anisotropic conductive member is formed in a frame along the electrode of the semiconductor element, the resin layer being filled inside of the anisotropic conductive member formed in the frame.

11. The semiconductor device as set forth in claim 10:

wherein the anisotropic conductive member is partly truncated.

12. The semiconductor device as set forth in claim 11:

wherein at least one truncation is formed at a corner of the anisotropic conductive member formed in the frame.

13. The semiconductor device as set forth in claim 9:

wherein the conductive particles intervened between the protrusion and the electrode of the semiconductor element possesses a shape having an approximately elliptic vertical section having a minor axis in a direction of a thickness and a major axis in a longitudinal direction of the board.

14. The semiconductor device as set forth in claim 13:

wherein a ratio of the minor axis to the major axis is in a range of 1:2 to 1:3.

15. The semiconductor device as set forth in claim 9:

wherein the conductive particles are comprised of elastic material having a conductive material layer on a surface thereof.

16. The semiconductor device as set forth in claim 9:

wherein a tip end of the protrusion and an electrode of the semiconductor element are in direct contact.

* * * * *

UNITED STATES PATENT AND TRADEMARK OFFICE
CERTIFICATE OF CORRECTION

PATENT NO. : 6,388,321 B1
DATED : May 14, 2002
INVENTOR(S) : Hirai et al.

It is certified that error appears in the above-identified patent and that said Letters Patent is hereby corrected as shown below:

<u>Title page,</u>
Item [54], in the title, after "FILLING" insert -- THE --.

Signed and Sealed this

Twenty-seventh Day of August, 2002

Attest:

JAMES E. ROGAN
Attesting Officer   Director of the United States Patent and Trademark Office